United States Patent
Kim et al.

(10) Patent No.: US 10,697,828 B2
(45) Date of Patent: Jun. 30, 2020

(54) MULTISPECTRAL OPTICAL SENSOR AND METHOD OF MANUFACTURING THE SAME

(71) Applicant: KOREA ELECTRONICS TECHNOLOGY INSTITUTE, Seongnam-si, Gyeonggi-do (KR)

(72) Inventors: Kunnyun Kim, Yongin-si (KR); Yeon Hwa Kwak, Seoul (KR); Hae Kwan Oh, Suwon-si (KR)

(73) Assignee: KOREA ELECTRONICS TECHNOLOGY INSTITUTE, Gyeonggi-do (KR)

( * ) Notice: Subject to any disclaimer, the term of this patent is extended or adjusted under 35 U.S.C. 154(b) by 381 days.

(21) Appl. No.: 15/873,845

(22) Filed: Jan. 17, 2018

(65) Prior Publication Data

US 2018/0143070 A1   May 24, 2018

Related U.S. Application Data

(63) Continuation of application No. PCT/KR2015/007466, filed on Jul. 17, 2015.

(51) Int. Cl.
  *G01J 1/42* (2006.01)
  *G01J 3/02* (2006.01)
  (Continued)

(52) U.S. Cl.
  CPC ............. *G01J 1/429* (2013.01); *B06B 1/06* (2013.01); *G01J 1/047* (2013.01); *G01J 3/0205* (2013.01);
  (Continued)

(58) Field of Classification Search
  CPC ........ G01J 1/429; G01J 3/0205; G01J 3/2803; G01J 1/047; G01J 5/44; G01J 3/28;
  (Continued)

(56) References Cited

U.S. PATENT DOCUMENTS

| | | | |
|---|---|---|---|
| 6,559,736 B2 * | 5/2003 | Lu | ............ H03H 9/02976 257/14 |
| 7,473,551 B2 | 1/2009 | Warthoe | |

(Continued)

FOREIGN PATENT DOCUMENTS

| | | |
|---|---|---|
| JP | 09-243618 A | 9/1997 |
| KR | 20-0258790 Y1 | 12/2001 |
| KR | 10-2012-0043853 A | 5/2012 |

OTHER PUBLICATIONS

Office Action of corresponding Korean Patent Application No. 10-2014-0063215—7 pages (dated Jul. 30, 2015).

(Continued)

*Primary Examiner* — Seung C Sohn
(74) *Attorney, Agent, or Firm* — Knobbe Martens Olson & Bear LLP

(57) ABSTRACT

A multispectral optical sensor is disclosed. In one embodiment, the multispectral optical sensor includes a piezoelectric material, a first sensing layer and a second sensing layer spaced apart from each other on the piezoelectric material and configured to change the propagation speed of the acoustic wave propagated through the piezoelectric material by receiving ultraviolet light and visible light, respectively. The multiple optical sensor further includes a first acoustic wave output part and a second acoustic wave output part disposed on the piezoelectric material respectively corresponding to the first and second sensing layers and configured to generate an electrical signal based on the changed acoustic wave. The multiple optical sensor measures the intensity of ultraviolet and visible light using a single sensor by detecting the change in frequency, and measures the frequency change in the acoustic wave using zinc oxide, gallium nitride), or cadmium sulfide nanoparticles.

15 Claims, 6 Drawing Sheets

(51) Int. Cl.
  *G01J 3/28* (2006.01)
  *G01V 8/00* (2006.01)
  *H01L 27/144* (2006.01)
  *G01J 1/04* (2006.01)
  *G01J 5/44* (2006.01)
  *H01L 31/0256* (2006.01)
  *B06B 1/06* (2006.01)
  *H01L 31/09* (2006.01)

(52) U.S. Cl.
  CPC ............... *G01J 3/28* (2013.01); *G01J 3/2803* (2013.01); *G01J 5/44* (2013.01); *G01V 8/00* (2013.01); *H01L 27/144* (2013.01); *H01L 31/0256* (2013.01); *H01L 31/09* (2013.01)

(58) Field of Classification Search
  CPC ......... G01V 8/00; H01L 27/144; H01L 31/09; H01L 31/0256; B06B 1/06
  USPC .......................................... 250/214.1, 214 R
  See application file for complete search history.

(56) References Cited

U.S. PATENT DOCUMENTS

| | | |
|---|---|---|
| 2003/0201694 A1 | 10/2003 | Lu et al. |
| 2005/0116263 A1 | 6/2005 | Lu et al. |
| 2007/0159027 A1* | 7/2007 | Tsai ..................... G01N 29/022 310/313 R |
| 2009/0289395 A1 | 11/2009 | Chou |
| 2012/0058546 A1 | 3/2012 | Lee et al. |

OTHER PUBLICATIONS

International Search Report dated Apr. 22, 2016 of PCT/KR2015/007466 which is the parent application—2 pages.

* cited by examiner

AZ 5214 patterning

Al deposition

PR stripping

ZnO, GaN or CdS nanoparticle
spincoating & annealing

MULTISPECTRAL OPTICAL SENSOR AND METHOD OF MANUFACTURING THE SAME

CROSS-REFERENCE TO RELATED APPLICATIONS

This application is a continuation application, and claims the benefit under 35 U.S.C. §§ 120 and 365 of PCT Application No. PCT/KR2015/007466, filed on Jul. 17, 2015, which is hereby incorporated by reference.

BACKGROUND

Technical Field

The present disclosure relates to a multispectral optical sensor and a method of manufacturing the same. More particularly, the present disclosure relates to a multispectral optical sensor capable of measuring the intensity of ultraviolet (UV) and visible light by detecting a change in frequency.

Related Art

UV tron or photomultiplier tube can detect ultraviolet light. UV tron is of a structure in which a positive electrode and a negative electrode are opposed to each other in a container formed of a material allowing the passage of UV light and connected to a DC power source through series resistance. When the negative electrode is irradiated with UV light from the outside, photoelectrons are emitted by the photoelectric effect on the surface of the negative electrode. The photomultiplier tube prepared using borosilicate glass has sensitivity to a wavelength of 300 nm or more and the photomultiplier tube prepared using quartz glass has sensitivity to a wavelength of 160 nm or more. The channel tron is a type of secondary electron multiplier tube and has sensitivity to UV light in the range of 50 nm to 150 nm.

In the past, the current-voltage characteristic of a sensing layer was measured in order to confirm whether the sensing layer used appropriately reacts with the UV light. In a method of measuring the change of current in a thin film according to the UV radiation, the detection of a trace amount had a problem in that it required a highly-advanced measurement circuit thus deteriorating price competitiveness.

Korean Utility Patent No. 20-0258790 relates to a device sensing an ultraviolet. The patent discloses a UV detector that differentially senses and indicates UVA and UVB which are harmful to human body.

U.S. Pat. No. 7,473,551 relates to nano-mechanic microsensors and methods for detecting target analytes and the patent discloses nano-mechanic microsensors using a surface acoustic wave and methods thereof.

The present disclosure is made in association with a Korean National Research and Development Project with respect to advanced technology development project in the field of sensor industry (Research Project Name: Development of the Multi-Sensor for UV, Ambient Light, and Proximity for Next Smart Device; Project Identification Number: 10064078; Supporting Central Administrative Agency: Ministry of Trade, Industry and Energy of Korea (MOTIE).

The disclosure of this section is to provide background of the invention. Applicant notes that this section may contain information available before this application. However, by providing this section, Applicant does not admit that any information contained in this section constitutes prior art.

SUMMARY

An embodiment of the present invention provides a multispectral optical sensor technology which can measure the intensity of ultraviolet (UV) and visible light by detecting the change in frequency using a single sensor.

An embodiment of the present invention provides a multispectral optical sensor technology which can measure the change in frequency of an acoustic wave using zinc oxide (ZnO), gallium nitride (GaN) or cadmium sulfide (CdS) nanoparticles.

An embodiment of the present invention provides a multispectral optical sensor technology which can secure price competitiveness even in a case where a trace amount of UV and visible light is to be detected.

In embodiments, a multispectral optical sensor includes a piezoelectric material, a first sensing layer and a second sensing layer spaced apart from each other on the piezoelectric material. The first sensing layer and the second sensing layer change the propagation speed of the acoustic wave propagated through the piezoelectric material, by receiving ultraviolet light and visible light, respectively. The sensor further includes a first acoustic wave output part and a second acoustic wave output part disposed on the piezoelectric material to be in one-to-one correspondence to the first and second sensing layers. The first acoustic wave output part and the second acoustic wave output part generate an electrical signal based on the changed acoustic wave, respectively.

In an embodiment, the multiple optical sensor further includes an acoustic wave input part, which is disposed between the first and second sensing layers and provides the same acoustic wave to each of the first and second sensing layers, respectively.

In an embodiment, the first and second acoustic wave output parts are opposed to the acoustic wave input part being centered on each of the first and second sensing layers, respectively.

In an embodiment, the acoustic wave input part can be implemented by an interdigital transducer formed through aluminum (Al) deposition.

In an embodiment, the multispectral optical sensor further includes the first and second acoustic wave input parts, which are disposed on the piezoelectric material and provide a first acoustic wave and a second acoustic wave to each of the first and second sensing layers.

In an embodiment, the first and second acoustic wave output parts are opposing to each of the first and second acoustic wave input parts, respectively, being centered on each of the first and second sensing layers, respectively.

In an embodiment, the first and second acoustic wave input parts provide the first and second acoustic waves having frequencies different from each other.

In an embodiment, the first sensing layer, upon sensing the ultraviolet radiation, changes the speed of the acoustic wave passing through a lower end thereof by changing the electrical conductivity.

In an embodiment, the first sensing layer is formed by spin-coating of zinc oxide (ZnO) or gallium nitride (GaN) nanoparticles on the first acoustic wave output part and the piezoelectric material.

In an embodiment, the second sensing layer, upon sensing visible light, changes the speed of the acoustic wave passing through a lower end thereof by changing the electrical conductivity.

In an embodiment, the second sensing layer is formed by spin-coating of cadmium sulfide (CdS) nanoparticles on the second acoustic wave output part and the piezoelectric material.

In an embodiment, the first and second sensing layers improve electric or mechanical properties by annealing the spin-coated first and second sensing layers.

In an embodiment, the piezoelectric material may be disposed at a lower end of the first and second sensing layers, the acoustic waver input part, and the first and second acoustic wave output parts, and an acoustic wave may pass through an upper end thereof.

An aspect of the invention provides a method for manufacturing a multispectral optical sensor. In embodiments, the method includes preparing a piezoelectric material, forming an interdigital transducer pattern (including a photosensitive area and a non-photosensitive area) on the piezoelectric material using a photoresist, depositing a thin film on the piezoelectric material in which the interdigital transducer pattern is formed, forming a first acoustic wave output part and a second acoustic wave output part by stripping the photosensitive region so as to remove the photoresist and the thin film deposited on the photoresist. In embodiments, the method further comprises forming a first sensing layer by spin-coating of the piezoelectric material in the direction of the first acoustic wave output part, among the piezoelectric material from which the photoresist is removed, with zinc oxide (ZnO) or gallium nitride (GaN), and forming a second sensing layer by spin-coating of the piezoelectric material in the direction of the second acoustic wave output part, among the piezoelectric material from which the photoresist is removed, with cadmium sulfide (CdS).

In an embodiment, the first and second sensing layers are formed on the same layer.

Certain embodiments have the following advantages. However, since a particular embodiment may provide some or all of the following advantages, the scope of the disclosure is not limited to the following advantages.

The multispectral optical sensor according to an embodiment of the present invention measures the intensity of UV and visible light by detecting the change in frequency.

The multispectral optical sensor according to an embodiment of the present invention secures price competitiveness because the change in frequency of an acoustic wave is detected using zinc oxide (ZnO), gallium nitride (GaN), or cadmium sulfide (CdS) nanoparticles.

The multispectral optical sensor according to an embodiment of the present invention, due to a broader surface area is more responsive to UV and visible light and show an improved sensitivity.

DETAILED DESCRIPTION OF EMBODIMENTS

The scope of the present invention is not limited to the embodiments described in the specification.

The meaning of the terms described in the embodiments of the present invention can be understood as follows.

The terms "first", "second", etc., are intended to distinguish one component from another.

It is to be understood that when an element is referred to as being "connected" to another element, it may be directly connected to the other element, although other elements may be present in between. Meanwhile, when an element is referred to as being "directly connected" to another element, it should be understood that there are no intervening elements present. Other expressions that describe the relationship between the components, such as "between" and "directly between" or "neighboring to" and "directly adjacent to" or the like should be interpreted as well.

Figure 1:
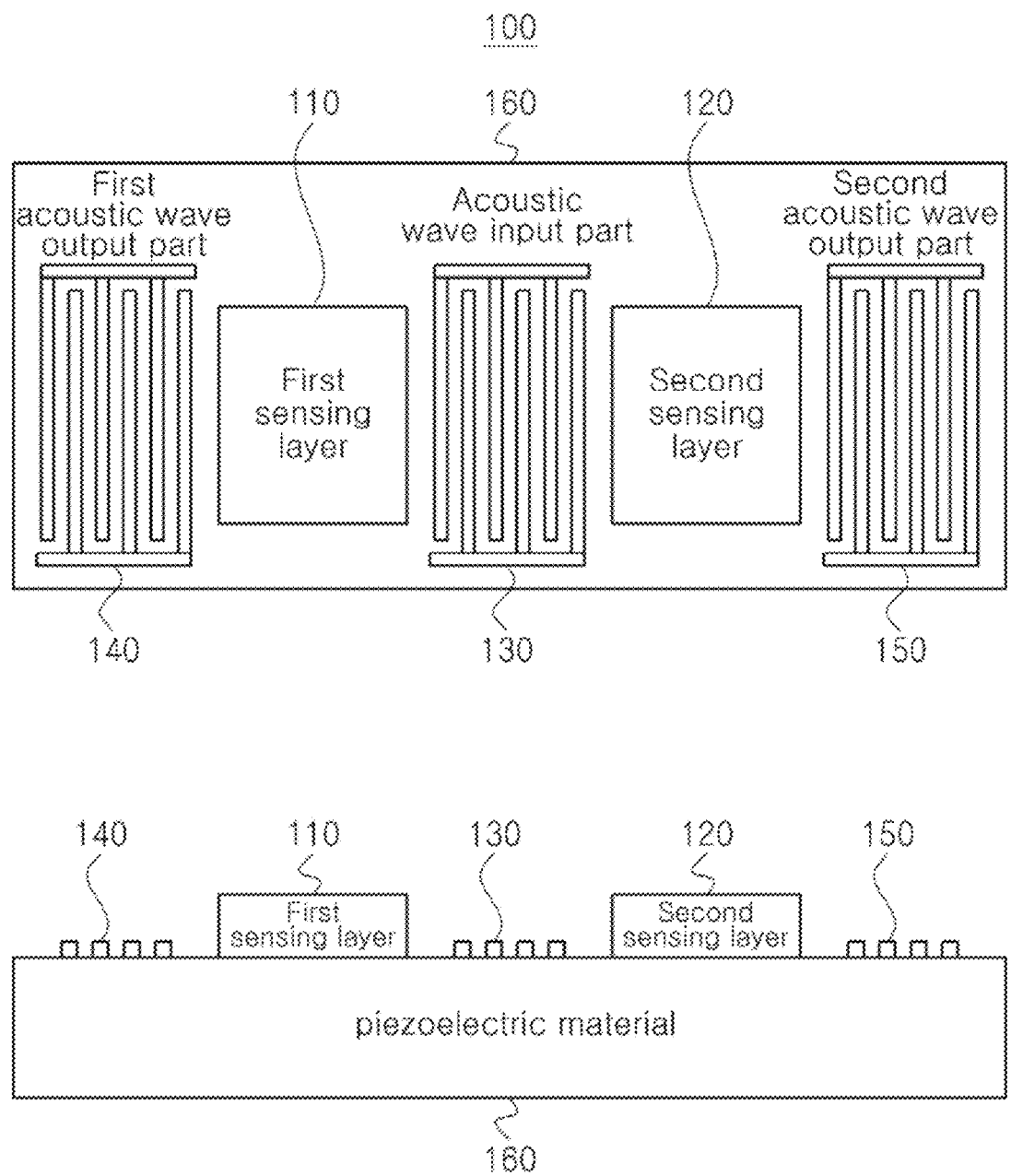
FIG. 1 is a schematic diagram showing a constitution of a multispectral optical sensor according to an embodiment of the present invention.

As used herein, the singular forms "a," "an", and "the" are intended to include the plural forms as well, unless the context clearly indicates otherwise. It will be further understood that the terms "comprise", "include", "have", etc. when used in this specification, specify the presence of stated features, integers, steps, operations, constituting elements, components, or combinations thereof, but do not preclude the presence or addition of one or more other features, integers, steps, operations, constituting elements, components, or combinations thereof. FIG. 1 is a schematic diagram showing a constitution of a multispectral optical sensor according to an embodiment of the present invention.

Referring to FIG. 1, a multispectral optical sensor 100 includes a first sensing layer 110, a second sensing layer 120, an acoustic wave input part 130, a first acoustic wave output part 140, a second acoustic wave output part 150, and a piezoelectric material 160.

The first sensing layer 110 is disposed at a first end of the acoustic wave input part 130 on the piezoelectric material 160. The first sensing layer 110 may correspond to a material that can sense the UV light. The material can change its own properties by reacting with the UV light. In an embodiment, the first sensing layer 110 is implemented using zinc oxide (ZnO) or gallium nitride (GaN) nanoparticles, and the absorption rate of zinc oxide (ZnO) nanoparticles is explained below with reference to FIG. 4.

In an embodiment, the first sensing layer 110 is formed by spin-coating of zinc oxide (ZnO) or gallium nitride (GaN) nanoparticles on a part of the acoustic wave input part 130, the first acoustic wave output part 140, and the piezoelectric material 160. For example, the electric or mechanical properties of the first sensing layer 110 can be improved by annealing the spin-coated sensing layer.

The second sensing layer 120 is disposed at a second end of the acoustic wave input part 130 on the piezoelectric material 160. The second sensing layer 120 may correspond to a material that can sense the visible light, and the material may react with the visible light to change its own properties.

In an embodiment, the second sensing layer 120 is formed by spin-coating of cadmium sulfide (CdS) on a part of the acoustic wave input part 130, second acoustic wave output part 150, and piezoelectric material 160. For example, the electric or mechanical properties of the second sensing layer 120 can be improved by annealing the spin-coated sensing layer.

That is, the first and second sensing layers 110 and 120 are spaced apart from each other on the piezoelectric material 160 and can change the propagation speed of the acoustic wave propagated through the piezoelectric material 160 by receiving the UV and visible light, respectively.

The acoustic wave input part 130 may be disposed between the first and second sensing layers 110 and 120 on the piezoelectric material 160 and thereby propagate the same acoustic wave in both directions. For example, the acoustic wave input part 130 can form an electric field by receiving external electrical signals and the piezoelectric material 160 can generate a mechanical vibration (i.e., an acoustic wave) through the formed electric field. As a result, the acoustic wave input part 130 can provide acoustic waves generated based on the external electrical signals to the first and second sensing layers 110 and 120, respectively.

In an embodiment, the acoustic wave input part 130 is implemented by an interdigital transducer (IDT) formed through aluminum (Al) deposition. For example, the interdigital transducer can efficiently generate acoustic waves and propagate the acoustic waves in both directions along the solid surface (e.g., between the first sensing layer 110 and the piezoelectric material 160 and between the second sensing layer 120 and the piezoelectric material 160). For example, the acoustic wave input part 130 can be implemented by an interdigital transducer when the metal electrode is disposed on the piezoelectric material 160 and may convert an electrical signal to an acoustic wave. In an embodiment, the acoustic wave input part is implemented as a lattice structure, and the lattice structure refers to a structure in which the horizontal and vertical lines intersect at right angles at intervals.

The first acoustic wave output part 140 is disposed on the other end of the first sensing layer 110 on the piezoelectric material 160. In an embodiment, the first acoustic wave output part 140 may be disposed to be opposed to the acoustic wave input part 130 being centered on the first sensing layer 110. The first acoustic wave output part 140 can generate an electrical signal when a mechanical vibration generated by the acoustic wave input part 130 (i.e., an acoustic wave) is applied. As a result, the first acoustic wave output part 140 can generate an electrical signal based on the acoustic waves provided by the acoustic wave input part 130 and thereby sense the change in frequency of the generated electrical signal.

The second acoustic wave output part 150 is disposed on the other end of the second sensing layer 120 on the piezoelectric material 160. In an embodiment, the second acoustic wave output part 150 may be disposed to be opposed to the acoustic wave input part 130 being centered on the second sensing layer 120. The second acoustic wave output part 150 can generate an electrical signal when a mechanical vibration generated by the acoustic wave input part 130 (i.e., an acoustic wave) is applied. As a result, the second acoustic wave output part 150 can generate an electrical signal based on the acoustic waves provided by the acoustic wave input part 130 and thereby sense the change in frequency of the generated electrical signal.

In an embodiment, the first and second acoustic wave output parts 140 and 150 can be implemented by an interdigital transducer formed through aluminum (Al) deposition. The interdigital transducer can efficiently detect the acoustic wave propagated along the solid surface (e.g., between the first sensing layer 110 and the piezoelectric material 160 and between the second sensing layer 120 and the piezoelectric material 160). For example, in a case where a metal electrode is disposed on the piezoelectric material 160, the first and second acoustic wave output parts 140 and 150 can be implemented by an interdigital transducer (IDT) and they can act as a frequency filter to filter the frequency of a certain band during the process of converting the propagated acoustic waves into electrical signals. In an embodiment, the first and second acoustic wave output parts 140 and 150 can be implemented as a lattice structure on the piezoelectric material 160. For example, the lattice structure refers to a structure in which the horizontal and vertical lines intersect at right angles at intervals.

The piezoelectric material 160 can generate a mechanical vibration (i.e., an acoustic wave) when an electrical signal is applied and an electrical signal (e.g., voltage) can be generated by applying the mechanical vibration to a piezoelectric body. In an embodiment, the piezoelectric material 160 includes a piezoelectric substrate (e.g., a semiconductor substrate) or a piezoelectric thin film. A particular frequency band of mechanical vibration may be used as a reference signal source for the multispectral optical sensor 100. That is, the piezoelectric material 160 can generate a mechanical vibration (i.e., an acoustic wave) when an electrical signal is applied through the piezoelectric and reverse piezoelectric effects, and an electrical signal can be generated when a mechanical vibration is applied.

Figure 2:
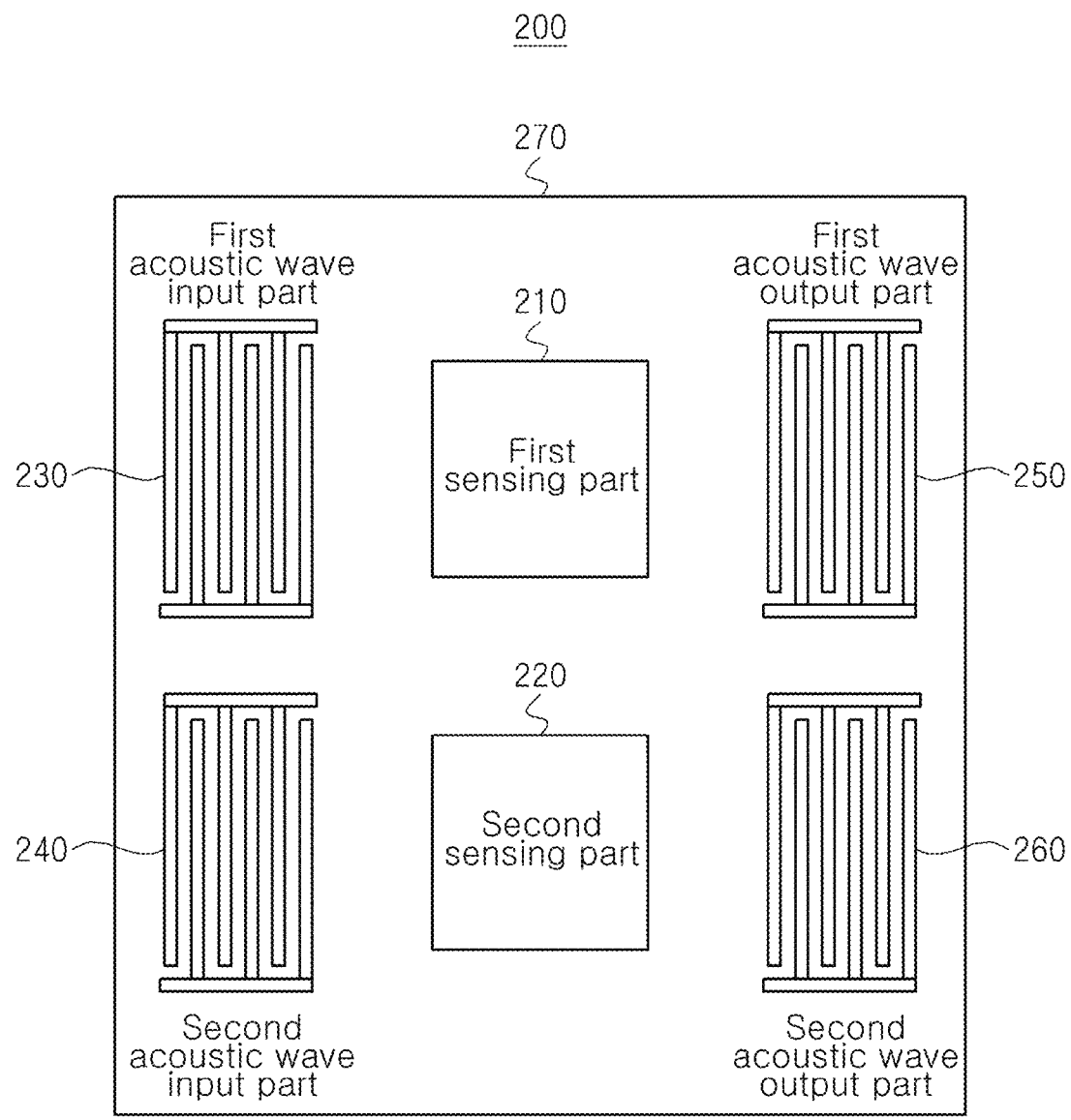
FIG. 2 is a schematic diagram showing a constitution of a multispectral optical sensor according to an embodiment of the present invention.

FIG. 2 is a schematic diagram showing a constitution of a multispectral optical sensor according to another embodiment of the present invention.

Referring to FIG. 2, a multispectral optical sensor 200 include a first sensing layer 210, a second sensing layer 220, a first acoustic wave input part 230, a second acoustic wave input part 240, a first acoustic wave output part 250, a second acoustic wave output part 260, and a piezoelectric material 270.

The first sensing layer 210 may be disposed on the piezoelectric material 270 and may correspond to a material that can sense the UV light. The material can change its own properties by reacting with the UV light. In an embodiment, the first sensing layer 210 can be implemented using zinc oxide (ZnO) or gallium nitride (GaN) nanoparticles, and the absorption rate of zinc oxide (ZnO) nanoparticles is explained below with reference to FIG. 4.

In an embodiment, the first sensing layer 210 is formed by spin-coating of zinc oxide (ZnO) or gallium nitride (GaN) nanoparticles on a part of the acoustic wave input part 230, first acoustic wave output part 250, and piezoelectric material 270. For example, the electric or mechanical properties of the first sensing layer 210 can be improved by annealing the spin-coated sensing layer.

The second sensing layer 220 is disposed at a lower end of the first sensing layer on the piezoelectric material 270. The second sensing layer 220 may correspond to a material that can sense the visible light, and the material may react with the visible light to change its own properties. In an embodiment, the second sensing layer 120 is formed by spin-coating of cadmium sulfide (CdS) nanoparticles on a part of the second acoustic wave input part 240, second acoustic wave output part 260, and piezoelectric material 270. For example, the electric or mechanical properties of the second sensing layer 220 can be improved by annealing the spin-coated sensing layer.

The first acoustic wave input part 230 may be disposed at a first end of the first sensing layer 210 on the piezoelectric material 270 and may be disposed to be opposed to the first acoustic wave output part 250 being centered on the first sensing layer 210. The second acoustic wave input part 240 may be disposed at a first end of the second sensing layer 220 on the piezoelectric material 270 and may be disposed to be opposed to the second acoustic wave output part 260 being centered on the second sensing layer 220.

The first and second acoustic wave input parts 230 and 240 can form an electric field by receiving external electrical signals and the piezoelectric material 270 can generate a mechanical vibration (i.e., an acoustic wave) through the formed electric field. As a result, the first and second acoustic wave input parts 230 and 240 can provide acoustic waves generated based on the external electrical signals to the first and second sensing layers 210 and 220, respectively.

The first and second acoustic wave input parts 230 and 240 may be operated at different frequencies due to the gaps differently formed thereon. Since acoustic waves have relatively low mutual interference, when the first and second acoustic wave output parts 250 and 260 simultaneously measures the change in frequency, the first and second acoustic wave output parts 250 and 260 can easily separate the two signals. For example, when the first acoustic wave input part 230 is operated at 180 MHz and the second acoustic wave input part 240 is operated at 360 MHz, electrical signals at different frequencies can be measured because the first and second acoustic wave output parts 250 and 260 have operating frequencies different from each other.

In an embodiment, the first and second acoustic wave input parts 230 and 240 can be implemented by an interdigital transducer (IDT) formed through aluminum (Al) deposition. Each interdigital transducer can efficiently generate acoustic waves with different operating frequencies and propagate the acoustic waves along the solid surface (e.g., between the first sensing layer 210 and the piezoelectric material 270 and between the second sensing layer 220 and the piezoelectric material 270). For example, in a case where a metal electrode is disposed on the piezoelectric material 270, the first and second acoustic wave input parts 230 and 240 can be implemented by an IDT and can convert an electrical signal to an acoustic wave. In an embodiment, the first and second acoustic wave input parts 230 and 240 can be implemented as a lattice structure. For example, the lattice structure refers to a structure in which the horizontal and vertical lines intersect at right angles.

The first acoustic wave output part 250 may be disposed at a second end of the first sensing layer 210 on the piezoelectric material 270. In an embodiment, the first acoustic wave output part 250 may be disposed to be opposed to the first acoustic wave input part 230 being centered on the first sensing layer 210. The first acoustic wave output part 250 can generate an electrical signal when a mechanical vibration generated by the acoustic wave input part 230 (i.e., an acoustic wave) is applied. As a result, the first acoustic wave output part 250 can generate an electrical signal based on the acoustic waves provided by the first acoustic wave input part 230 and thereby sense the change in frequency of the generated electrical signal.

The second acoustic wave output part 260 is disposed at a second end of the second sensing layer 220 on the piezoelectric material 270. In an embodiment, the second acoustic wave output part 260 is disposed to be opposed to the second acoustic wave input part 240 being centered on the second sensing layer 220. The second acoustic wave output part 260 can generate an electrical signal when a mechanical vibration generated by the second acoustic wave input part 240 (i.e., an acoustic wave) is applied. As a result, the second acoustic wave output part 260 can generate an electrical signal based on the acoustic waves provided by the second acoustic wave input part 240 and thereby sense the change in frequency of the generated electrical signal.

In an embodiment, the first and second acoustic wave output parts 250 and 260 are implemented by an interdigital transducer (IDT) formed through aluminum (Al) deposition. The interdigital transducer can efficiently detect the acoustic waves propagated along the solid surface (e.g., between the first sensing layer 210 and the piezoelectric material 270 and between the second sensing layer 220 and the piezoelectric material 270). For example, in a case where a metal electrode is disposed on the piezoelectric material 270, the first and second acoustic wave output parts 250 and 260 can be implemented by an interdigital transducer (IDT) and act as a frequency filter to filter the frequency of a certain band during the process of converting the propagated acoustic waves into electrical signals. In an embodiment, the first and second acoustic wave output parts 250 and 260 can be implemented as a lattice structure on the piezoelectric material 270. For example, the lattice structure refers to a structure in which the horizontal and vertical lines intersect at right angles at intervals.

FIGS. 3A to 3D illustrate a process for manufacturing a multispectral optical sensor according to an embodiment of the present invention.

Figure 3A:
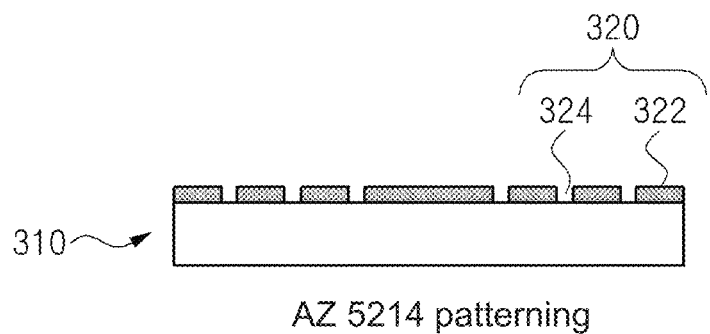
FIGS. 3A to 3D illustrate a process for manufacturing a multispectral optical sensor according to an embodiment of the present invention.

In FIG. 3A, the piezoelectric material 160 may be patterned through a photoresist 322 and thereby produce a pattern 320. For example, the pattern 320 can form a concavity and convexity from the cross-sectional view of the piezoelectric material 160, and may include the photosensitive region (i.e., a protruded region) 322 and a non-photosensitive region (i.e., a recessed region) 324. Finally, the non-photosensitive region (i.e., a recessed region) 324 may remain on the piezoelectric material 160 and the photosensitive region (i.e., a protruded region) 322 may be removed. The photosensitive 322 can cause a chemical reaction when light is irradiated thereon to change its chemical properties and may correspond to AZ5214 photoresist. The main reason is that the layer is thin and uniform and is thus useful to easily obtain a fine circuit pattern, and may have good sensitivity to UV light. In an embodiment, the non-photosensitive region 324 is implemented as a lattice structure and thereby form an interdigital transducer (IDT).

Figure 3B:
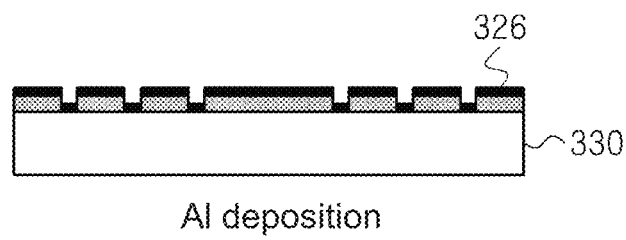

In FIG. 3B, the piezoelectric material 310 on which a pattern is formed may be deposited with a thin film 326. In an embodiment, the deposition is grown by chemical vapor deposition (CVD) process. In another embodiment, deposition is achieved by low pressure CVD, plasma enhanced CVD, or atmospheric pressure CVD processes. Aluminum (Al) may be used as the thin film because aluminum has excellent malleability and ductility and good electrical conductivity. Additionally, oxides or nitrides may be used as the thin film 326.

Figure 3C:

In FIG. 3C, the photoresist 322 and the thin film 326 deposited on the photoresist 322 can be removed as the photosensitive region 322 is stripped off. For example, the photoresist 322 and the thin film 326 remaining on a piezoelectric material 330 deposited with aluminum can be removed using an alkali agent. The photosensitive region 322 means a region where the piezoelectric material 160 is patterned using a photosensitive liquid, and the non-photosensitive region 324 means a region excluding the photosensitive region 322. As a result, the non-photosensitive region 324 can be implemented as a lattice structure on the piezoelectric material 160 and thereby form an interdigital transducer. In an embodiment, the interdigital transducer is implemented using the aluminum (Al) deposited on the non-photosensitive region 324.

Figure 3D:
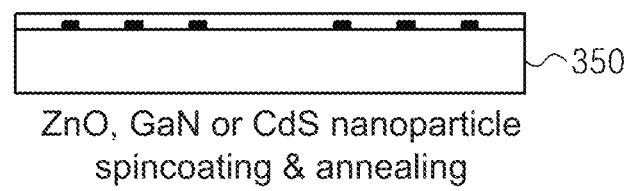

In FIG. 3D, among the piezoelectric material 340, in which the photoresist 322 and the deposited thin film 326 are removed, the piezoelectric material in the direction of the first acoustic wave output part 140 can undergo a primary spin-coating through zinc oxide (ZnO) or gallium nitride (GaN) nanoparticles and thereby produce the first sensing layer 110. Among the piezoelectric material which underwent the primary spin-coating, the piezoelectric material in the direction of the second acoustic wave output part 150 can undergo a secondary spin-coating through cadmium sulfide (CdS) nanoparticles and thereby produce the second sensing layer 120. That is, the first and second sensing layers 110 and 120 may be formed on the same layer. In an embodiment, the piezoelectric material 340, in which the photoresist 322 and the deposited thin film 326 are removed, is rotated at high speed when zinc oxide, gallium nitride, or cadmium sulfide nanoparticles are introduced. As a result, zinc oxide, gallium nitride, or cadmium sulfide nanoparticles can be thinly spread on the piezoelectric material 240.

In an embodiment, the sensing film 350 on a spin-coated piezoelectric material is annealed. The spin-coated sensing layer 350 may be heated at 200° C. or higher for about 1 hour. Once the spin-coated sensing layer 350 is annealed, the electric or mechanical properties can be improved.

Referring to FIG. 1 to FIG. 3D again, when UV light is applied to the first sensing layer 110 (that is, when the first sensing layer absorbs UV light) or visible light is applied on the second sensing layer 120 (that is, when the first sensing layer absorbs visible light), the rejoining of $e^-$ and $h^+$ occurs in the zinc oxide, and consequently the electrical properties (conductivity) changes. For example, the surface acoustic wave being propagated at the boundary between the first sensing layer 110 and the piezoelectric material 160 changes according to the change in the electrical conductivity of the first sensing layer 110, and the result is shown through the first acoustic wave output part 140.

The mechanism associated with the change in propagation speed of an acoustic wave can be expressed by the following equation.

$$\Delta v/vo = K^2/(2*(1+(\sigma/\sigma m)^2))$$

Figure 4:
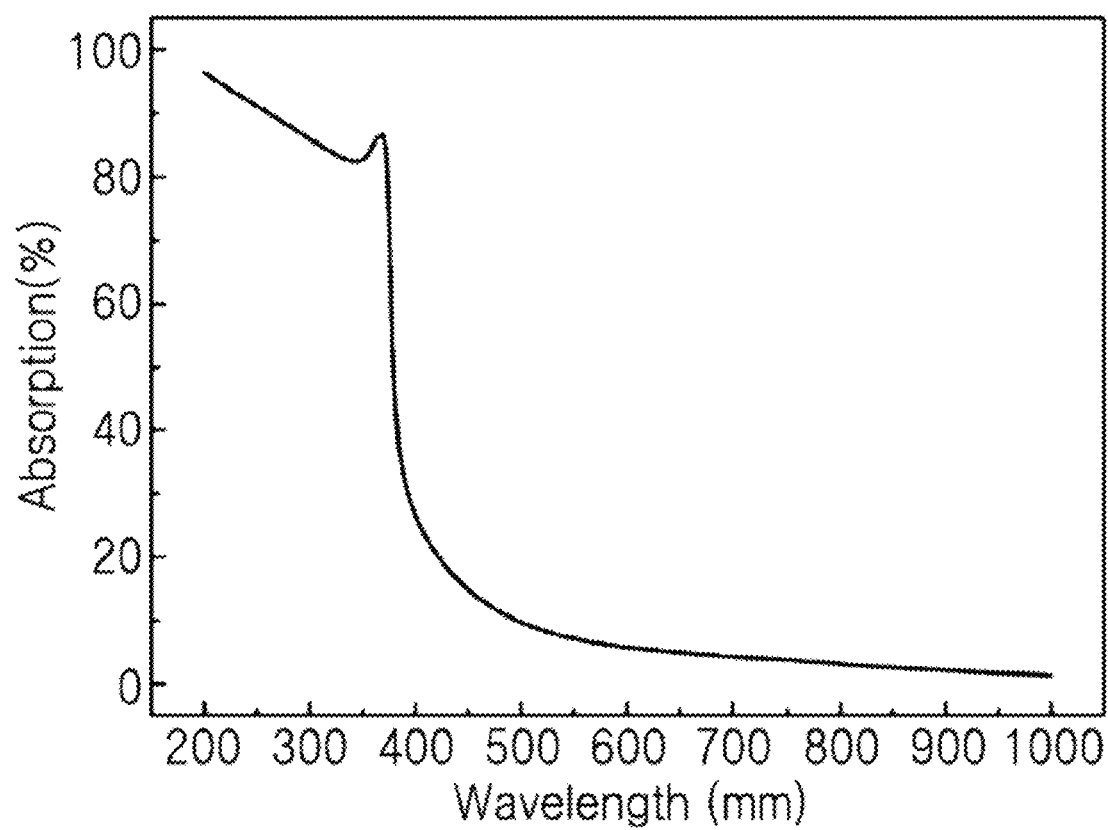
FIG. 4 is a graph showing the UV absorption rate according to the wavelength of zinc oxide (ZnO) nanoparticles according to an embodiment of the present invention.

$\Delta v$: change in propagation speed of an acoustic wave
$vo$: original propagation speed of an acoustic wave
$K^2$: electromechanical bonding force of a piezoelectric material (%)
$\sigma$: electrical conductivity of a piezoelectric material
$\sigma m$: electrical conductivity of a sensing layer FIG. 4 is a graph showing the UV absorption rate according to the wavelength of zinc oxide (ZnO) nanoparticles according to an embodiment of the present invention.

Referring to FIG. 4, the x and y axes represent the wavelength and UV absorption rate, respectively. The measured absorptivity can exhibit high absorptivity only at a wavelength of 400 nm or less.

As a result, zinc oxide nanoparticles exhibit an absorption rate of 80% or higher at a wavelength of 400 nm or less. Since the wavelength of UV light is between 100 nm and 380 nm, it can be seen that the UV absorption rate of zinc oxide nanoparticles is high.

Figure 5:
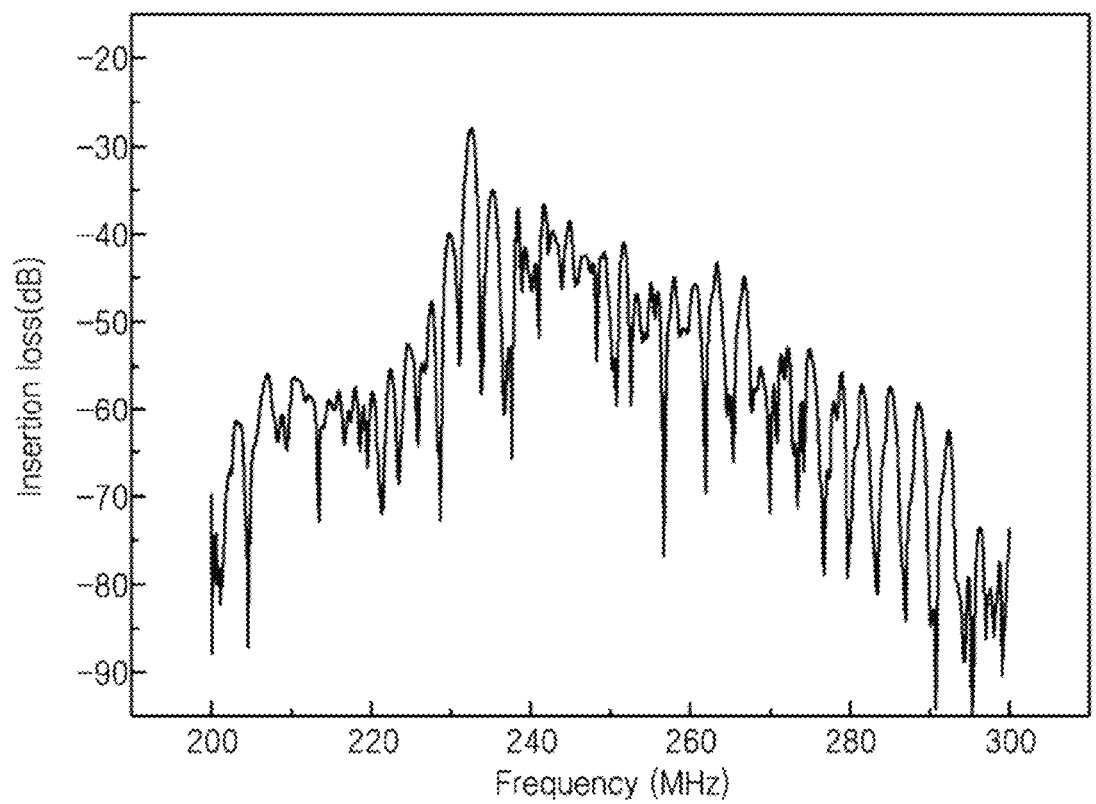
FIG. 5 is a graph showing a frequency response characteristic of a multispectral optical sensor in response to UV light.

FIG. 5 is a graph showing a frequency response characteristic of a multispectral optical sensor in response to UV light.

Referring to FIG. 5, the x and y axes represents the frequency and insertion loss, respectively. The center frequency (i.e., the highest gain region) can be measured based on the measurement of the insertion loss of the acoustic wave when no UV light is applied. That is, the frequency response characteristic of the first sensing layer 110 can be measured. In an embodiment, insertion loss refers to the internal loss that occurs on the operating frequency band as an acoustic wave passes through the first sensing layer 110. That is, the insertion loss refers to a loss caused when an acoustic wave generated based on an electrical signal passes through the first sensing layer 110. Accordingly, the operation of UV light can be figured out by measuring the change in the center frequency through the insertion loss.

Figure 6:
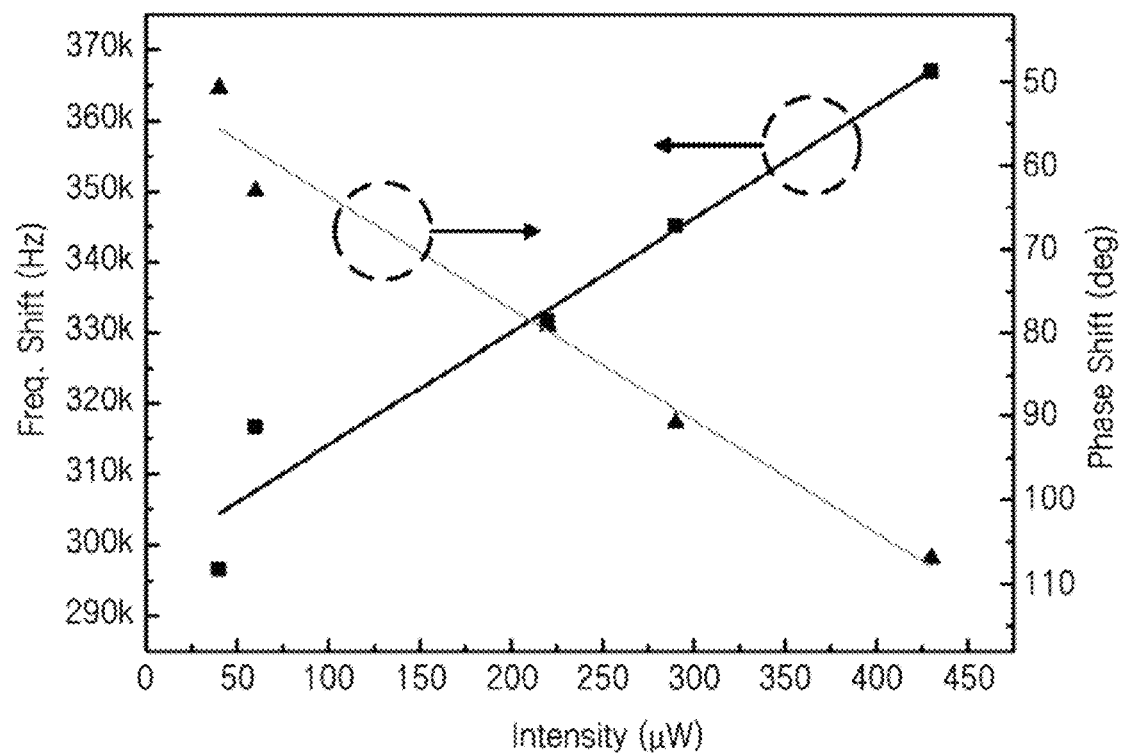
FIG. 6 is a graph showing a change in frequency of a multispectral optical sensor according to the UV intensity.

FIG. 6 is a graph showing a change in frequency of a multispectral optical sensor according to the UV intensity.

Referring to FIG. 6, the x-axis represents the intensity of UV light, and each y-axis represents frequency and phase. More specifically, the center frequency (i.e., the highest gain region) can be measured based on the measurement of the insertion loss of the acoustic wave according to the intensity of UV light when UV light is applied. In particular, the measured center frequency can be in a form proportional to the intensity of UV light.

Since a change in frequency can be measured when UV light is applied, the UV sensor can operate even when a trace amount of UV light is detected. Accordingly, the UV sensor does not require the advancement of a specific circuit and thus price competitiveness can be ensured.

In the above, the present invention has been explained with reference to certain embodiments. However, those skilled in the art will understand that various modifications and variations can be made in the present invention without departing from the spirit or scope of the present invention as defined by the following claims.

Certain embodiments of the present invention relate to a multispectral optical sensor capable of detecting a change in frequency and measuring ultraviolet and visible light using a single sensor, and a method of manufacturing the same, and they are industrially applicable.

What is claimed is:
1. A multispectral optical sensor comprising:
a piezoelectric material;
a first sensing layer and a second sensing layer spaced apart from each other on the piezoelectric material and configured to change a propagation speed of an acoustic wave through the piezoelectric material upon receiving ultraviolet light and visible light, respectively; and
a first acoustic wave output part and a second acoustic wave output part disposed on the piezoelectric material and respectively corresponding to the first and second sensing layers, wherein each of the first acoustic wave output part and the second acoustic wave output part is configured to generate an electrical signal based on the changed propagation speed of the acoustic wave.

2. The optical sensor of claim 1, further comprising an acoustic wave input part disposed between the first and second sensing layers and configured to provide the same acoustic wave to each of the first and second sensing layers.

3. The optical sensor of claim 2, wherein the first and second acoustic wave output parts are arranged to oppose the acoustic wave input part with respect to the first and second sensing layers.

4. The optical sensor of claim 2, wherein the acoustic wave input part comprises an interdigital transducer formed through aluminum (Al) deposition.

5. The optical sensor of claim 1, further comprising a first acoustic wave input part and a second acoustic wave input part disposed on the piezoelectric material and configured to respectively provide a first acoustic wave and a second acoustic wave to the first and second sensing layers.

6. The optical sensor of claim 5, wherein the first and second acoustic wave output parts are opposing the first and second acoustic wave input parts with respect to the first and second sensing layers, respectively.

7. The optical sensor of claim 5, wherein the first and second acoustic wave input parts are configured to respectively provide the first and second acoustic waves having frequencies different from each other.

8. The optical sensor of claim 1, wherein the first sensing layer is configured to change, upon sensing ultraviolet radiation, a speed of the acoustic wave passing through a lower end thereof by changing a electrical conductivity thereof.

9. The optical sensor of claim 8, wherein the first sensing layer comprises a coating of zinc oxide (ZnO) or gallium nitride (GaN) nanoparticles on the first acoustic wave output part and the piezoelectric material.

10. The optical sensor of claim 1, wherein the second sensing layer is configured to change, upon sensing a visible light, a speed of the acoustic wave passing through a lower end thereof by changing a electrical conductivity thereof.

11. The optical sensor of claim 10, wherein the second sensing layer comprises a coating of cadmium sulfide (CdS) nanoparticles on the second acoustic wave output part and the piezoelectric material.

12. The optical sensor of claim 10, wherein the first and second sensing layers are configured to improve electric or mechanical properties by annealing the spin-coated first and second sensing layers.

13. The optical sensor of claim 1, wherein the piezoelectric material is disposed at a lower end of the first and second sensing layers, the acoustic waver input part, and the first and second acoustic wave output parts, and an acoustic wave passes through an upper end thereof.

14. A method for manufacturing a multispectral optical sensor, comprising:

preparing a piezoelectric material;

forming an interdigital transducer pattern, including a photosensitive area and a non-photosensitive area, on the piezoelectric material using a photoresist;

depositing a thin film on the piezoelectric material in which the interdigital transducer pattern is formed;

forming a first acoustic wave output part and a second acoustic wave output part by stripping the photosensitive region so as to remove the photoresist and the thin film deposited on the photoresist;

forming a first sensing layer by spin-coating of the piezoelectric material in the direction of the first acoustic wave output part, among the piezoelectric material from which the photoresist is removed, with zinc oxide (ZnO) or gallium nitride (GaN); and forming a second sensing layer by spin-coating of the piezoelectric material in the direction of the second acoustic wave output part, among the piezoelectric material from which the photoresist is removed, with cadmium sulfide (CdS).

15. The method of claim 14, wherein the first and second sensing layers are formed on the same layer.

* * * * *